US012625675B2

(12) United States Patent
Hirotsu

(10) Patent No.: US 12,625,675 B2
(45) Date of Patent: May 12, 2026

(54) CONVOLUTIONAL COMPUTATION DEVICE

(71) Applicant: DENSO CORPORATION, Kariya-city (JP)

(72) Inventor: Teppei Hirotsu, Tokyo (JP)

(73) Assignee: DENSO CORPORATION, Kariya-city (JP)

( * ) Notice: Subject to any disclaimer, the term of this patent is extended or adjusted under 35 U.S.C. 154(b) by 1160 days.

(21) Appl. No.: 17/480,925

(22) Filed: Sep. 21, 2021

(65) Prior Publication Data

US 2022/0004364 A1    Jan. 6, 2022

Related U.S. Application Data

(63) Continuation of application No. PCT/JP2020/012728, filed on Mar. 23, 2020.

(30) Foreign Application Priority Data

Mar. 28, 2019    (JP) ................................. 2019-062744

(51) Int. Cl.
*G06F 7/544* (2006.01)
*G06F 17/15* (2006.01)
*G11C 19/38* (2006.01)

(52) U.S. Cl.
CPC .......... *G06F 7/5443* (2013.01); *G06F 17/153* (2013.01); *G11C 19/38* (2013.01)

(58) Field of Classification Search
CPC ..... G06F 7/5443; G06F 17/153; H03H 17/00; G06N 3/02; G11C 19/38
See application file for complete search history.

(56) References Cited

U.S. PATENT DOCUMENTS 5,764,557 A    6/1998  Hara et al.
9,747,548 B2    8/2017  Ross et al.
(Continued)

FOREIGN PATENT DOCUMENTS

JP        H06-318194 A    11/1994
JP        2019-179410 A    10/2019

OTHER PUBLICATIONS

Stein, Jonathan Y. Digital Signal Processing: A computer Science Perspective [textbook]. John Wiley & Sons, Inc. Print ISBN 0-471-29546-9, Online ISBN 0-471-20059-X. pp. 570-644. Retried from the Internet: <URL:https://onlinelibrary.wiley.com/doi/pdf/10.1002/047120059X> (Year: 2000).*

(Continued)

*Primary Examiner* — Matthew D Sandifer
(74) *Attorney, Agent, or Firm* — Posz Law Group, PLC

(57) ABSTRACT

A convolutional computation device includes a two-dimensional circulation shift register unit and one or more multiplier-accumulators. The two-dimensional circulation shift register has storage elements, cyclically shifts the data among the storage elements, provides one or more input window in a predetermined area, and selects the data stored in one of the storage elements disposed in the input window as input data. The one or more multiplier-accumulators generate output data by performing a multiply-accumulate operation on the input data input from the two-dimensional circulation shift register unit and weight data from a predetermined filter.

12 Claims, 12 Drawing Sheets

(56) References Cited

U.S. PATENT DOCUMENTS

| | | | |
|---|---|---|---|
| 9,986,187 B2 * | 5/2018 | Meixner | G06F 17/16 |
| 11,106,972 B1 * | 8/2021 | Verheyen | G06F 9/5027 |
| 2018/0005074 A1 | 1/2018 | Shacham et al. | |
| 2018/0032312 A1 | 2/2018 | Hansen et al. | |
| 2018/0329479 A1 * | 11/2018 | Meixner | G06T 7/73 |
| 2019/0205780 A1 * | 7/2019 | Sakaguchi | G06V 10/82 |

OTHER PUBLICATIONS

Maji, et al. Efficient Winograd or Cook-Toom Convolution Kernel Implementation on Widely Used Mobile CPUs [online]. Retrieved from the Internet: <URL: https://www.emc2-ai.org/hpca-19> (Year: 2019).*

EMC2. The 2nd EMC2—Energy Efficient Machine Learning and Cognitive Computing Co-located with the 25th IEEE International Symposium on High-Performance Computer Architecture HPCA 2019 [online]. Retrieved from the Internet: <URL: https://www.emc2-ai.org/hpca-19> (Year: 2019).*

Aydonat, Utku et al: "An OpenCL(TM) Deep Learning Accelerator on Arria 10", Proceedings of the 2017 CHI Conference on Human Factors in Computing Systems , CHI '17, ACM Press, New York, New York, USA, Feb. 22, 2017 (Feb. 22, 2017), pp. 55-64, [online] , <URL : https://dl.acm.org/doi/pdf/10.1145/3020078.3021738> p. 58, line 24 to 61.

* cited by examiner

| CYCLE | SHIFT | INPUT DATA |
|---|---|---|
| 0 | – | $d^{00}$ |
| 1-5 | LEFT SHIFT × 5 | $d^{01} - d^{05}$ |
| 6 | UP SHIFT × 1 | $d^{15}$ |
| 7-11 | RIGHT SHIFT × 5 | $d^{14} - d^{10}$ |
| 12 | UP SHIFT × 1 | $d^{20}$ |
| 13-17 | LEFT SHIFT × 5 | $d^{21} - d^{25}$ |
| 18 | UP SHIFT × 1 | $d^{35}$ |
| 19-23 | RIGHT SHIFT × 5 | $d^{34} - d^{30}$ |
| 24 | UP SHIFT × 1 | $d^{40}$ |
| 25-29 | LEFT SHIFT × 5 | $d^{41} - d^{45}$ |
| 30 | UP SHIFT × 1 | $d^{55}$ |
| 31-35 | RIGHT SHIFT × 5 | $d^{54} - d^{50}$ |

FIG. 10

| CYCLE | SHIFT | INPUT DATA | | | |
|---|---|---|---|---|---|
| | | $d_a$ | $d_b$ | $d_c$ | $d_d$ |
| 0 | – | $d^{00}$ | $d^{03}$ | $d^{30}$ | $d^{33}$ |
| 1–2 | LEFT SHIFT $\times 2$ | $d^{01}-d^{02}$ | $d^{04}-d^{05}$ | $d^{31}-d^{32}$ | $d^{34}-d^{35}$ |
| 3 | UP SHIFT $\times 1$ | $d^{12}$ | $d^{15}$ | $d^{42}$ | $d^{45}$ |
| 4–5 | RIGHT SHIFT $\times 2$ | $d^{11}-d^{10}$ | $d^{14}-d^{13}$ | $d^{41}-d^{40}$ | $d^{44}-d^{43}$ |
| 6 | UP SHIFT $\times 1$ | $d^{20}$ | $d^{23}$ | $d^{50}$ | $d^{53}$ |
| 7–8 | LEFT SHIFT $\times 2$ | $d^{21}-d^{22}$ | $d^{24}-d^{25}$ | $d^{51}-d^{52}$ | $d^{54}-d^{55}$ |

| | | |
|---|---|---|
| 0.50 | 0.00 | 0.00 |
| −0.50 | −0.50 | −0.50 |
| −0.17 | 0.17 | −0.17 |
| 0.17 | 0.33 | 0.67 |
| 0.00 | 0.00 | 1.00 |

B

| | | | | |
|---|---|---|---|---|
| 2.00 | 0.00 | 0.00 | 0.00 | 0.00 |
| −1.00 | −2.00 | 2.00 | −1.00 | 2.00 |
| −2.00 | −1.00 | −3.00 | 0.00 | −1.00 |
| 1.00 | 1.00 | 1.00 | 1.00 | −2.00 |
| 0.00 | 0.00 | 0.00 | 0.00 | 1.00 |

A

| | | |
|---|---|---|
| 1.00 | 0.00 | 0.00 |
| 1.00 | 1.00 | 1.00 |
| 1.00 | −1.00 | 1.00 |
| 1.00 | 2.00 | 4.00 |
| 0.00 | 0.00 | 1.00 |

CONVOLUTIONAL COMPUTATION DEVICE

CROSS REFERENCE TO RELATED APPLICATION

The present application is a continuation application of International Patent Application No. PCT/JP2020/012728 filed on Mar. 23, 2020, which designated the U.S. and claims the benefit of priority from Japanese Patent Application No. 2019-062744 filed on Mar. 28, 2019. The entire disclosures of all of the above applications are incorporated herein by reference.

TECHNICAL FIELD

The present disclosure relates to a convolutional computation device that performs a convolution calculation.

BACKGROUND

In the convolution calculation, output data is generated by convolving weight data forming a predetermined filter into the input data. In the conceivable convolutional computation device, the convolution calculation is processed by converting the convolution operation into a matrix operation

SUMMARY

According to an example, a convolutional computation device may include: a two-dimensional circulation shift register unit that has a plurality of storage elements, cyclically shifts the data among the plurality of storage elements, provides at least one input window in a predetermined area, and selects the data stored in one of the storage elements disposed in the input window as input data; and at least one multiplier-accumulator that generates output data by performing a multiply-accumulate operation on the input data input from the two-dimensional circulation shift register unit and weight data from a predetermined filter.

BRIEF DESCRIPTION OF THE DRAWINGS

The above and other objects, features and advantages of the present disclosure will become more apparent from the below-described detailed description made with reference to the accompanying drawings. In the drawings:

FIG. 7 is a conceptual diagram showing the movement of the input data range according to the first embodiment of the present disclosure;

FIG. 8 is a diagram showing a table of a series of shift operations according to the first embodiment of the present disclosure;

FIG. 10 is a diagram showing a table of a series of shift operations according to the second embodiment of the present disclosure;

FIG. 12 is a diagram showing a table of a constant matrix used in the multiply-accumulate operation of the third embodiment of the present disclosure.

DETAILED DESCRIPTION

As a result of detailed examination by the inventor, in the conceivable convolution computation device, since the convolution operation is converted into the matrix operation, it is necessary to convert the input data so that the matrix operation can be performed, and since it is necessary to handle the converted data in which the original input data is overlapped, the difficulty that the hardware and data processing increase and the power consumption increases has been found.

A convolutional computation device is provided with reducing power consumption.

One embodiment of the present disclosure provides a convolutional computation device including: a two-dimensional circulation shift register having a plurality of storage elements arranged two-dimensionally to store data, respectively, shifting the data cyclically among the plurality of storage elements, setting an input window in a predetermined area, and selecting the data stored in the storage elements in the input window as an input data; and a multiplier-accumulator generating an output data by performing a multiply-accumulate operation of the input data input from the two-dimensional circulation shift register and a weight data from a predetermined filter.

According to this, the power consumption in the convolutional computation device is reduced.

First Embodiment

A first embodiment of the present disclosure will be described below with reference to the drawings of FIGS. 1 to 8.

The convolutional computation circuit is used for a data flow processor (Data Flow Processor, hereinafter referred to as "DFP") for image recognition and object detection in an autonomous driving system.

In the convolutional computation circuit of the present embodiment, in the shift register 40, data elements are stored in a large number of storage elements 42 arranged two-dimensionally, and the data elements in the storage elements 42 within the input window 44 set in a predetermined area is selected as the input data d. In the multiplier-accumulator 50, the input data d input from the shift register 40 and the weight data g forming a predetermined filter are processed by the multiply-accumulate operation to generate output data Y. Here, the total data elements are sequentially shifted in the shift register 40, the data elements in the input window 44 are sequentially selected as the input data d, and the total output data Z is generated from the output data Y sequentially generated from the input data d.

Figure 1:
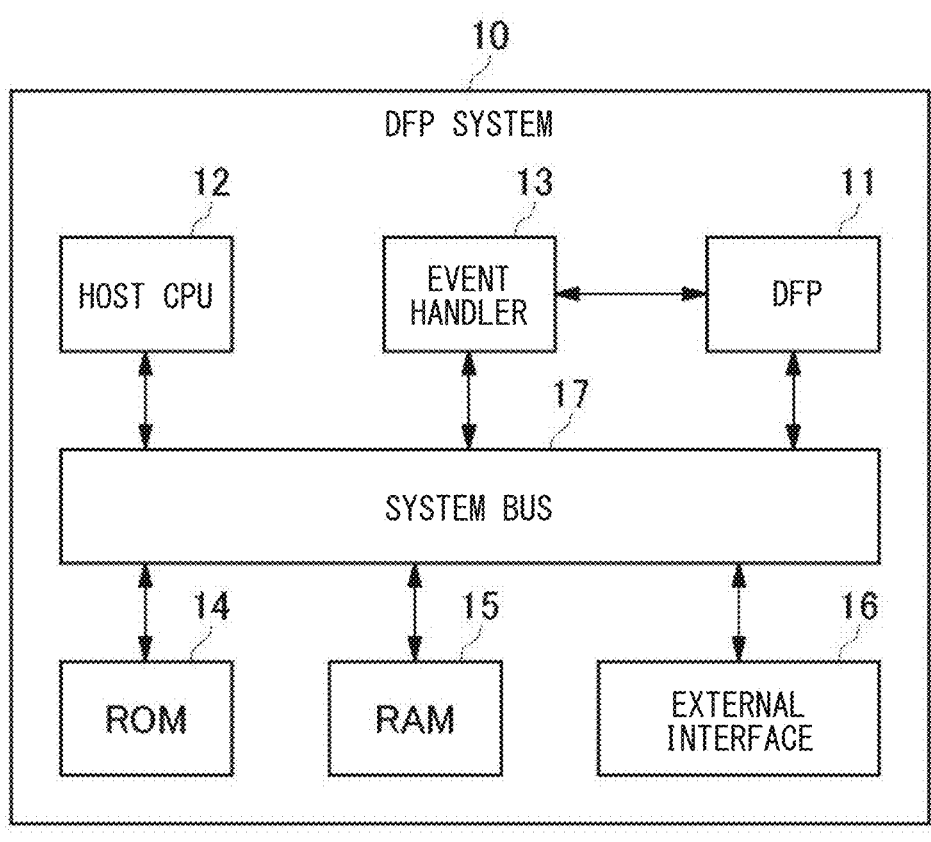
FIG. 1 is a block diagram showing a DFP system according to the first embodiment of the present disclosure.

The DFP system 10 will be outlined with reference to FIG. 1.

In the DFP system 10 of the present embodiment, the DFP 11 functions as an individual master for handling the heavy calculation load of the host CPU 12, can execute a program and an original fetch instruction, and supports an interruption process generated by the event handler 13. The DFP 11, the host CPU 12, the ROM 14, the RAM 15, and the external interface 16 transmit and receive data via the system bus 17.

Figure 2:
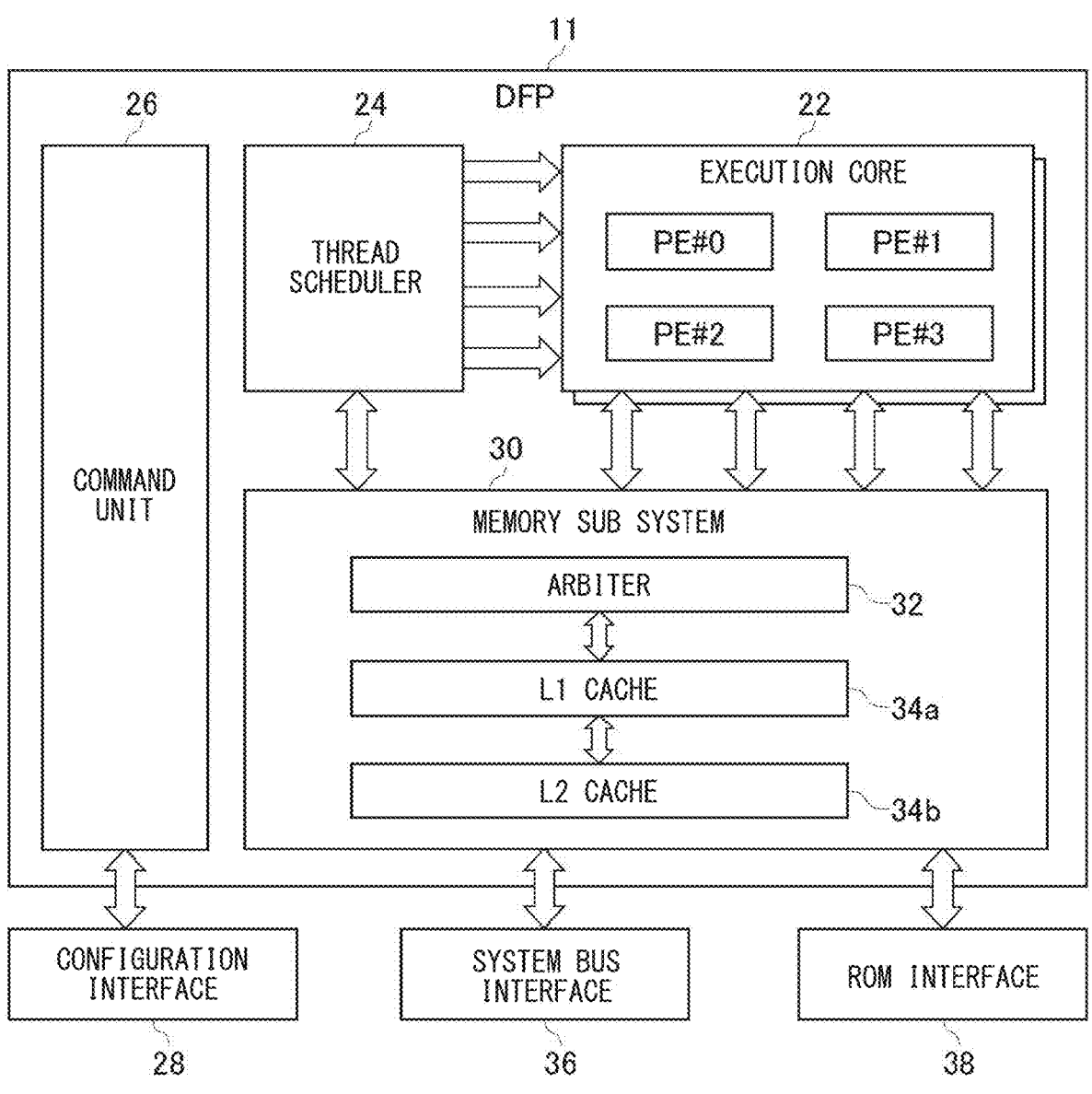
FIG. 2 is a block diagram showing a DFP according to the first embodiment of the present disclosure.

The DFP 11 will be outlined with reference to FIG. 2.

With regard to the DFP 11, it is possible to execute a plurality of threads in parallel even for different instruction streams by dynamically allocating registers and thread scheduling by hardware for a large number of threads. It is possible to generate such a large number of threads by automatically vectorizing the program code by the compiler and extracting the graph structure that maintains the task parallelism and graph parallelism of the program.

In the DFP 11, the plurality of execution cores 22 each have a large number of pipelines independently schedulable, and share resources among the four processing elements PE #0, PE #1, PE #2, and PE #3. The thread scheduler 24 realizes scheduling across a large number of threads and executes a large number of threads at the same time. The command unit 26 sends and receives data to and from the configuration interface 28, and functions as a command buffer. The memory sub system 30 is formed by an arbiter 32, an L1 cache 34*a*, and an L2 cach 34*b*, and transmits/ receives data to/from the system bus interface 36 and the ROM interface 38.

In the present embodiment, the convolutional computation circuit is used as one execution core 22 among the plurality of execution cores 22 included in the DFP 11.

Figure 3:
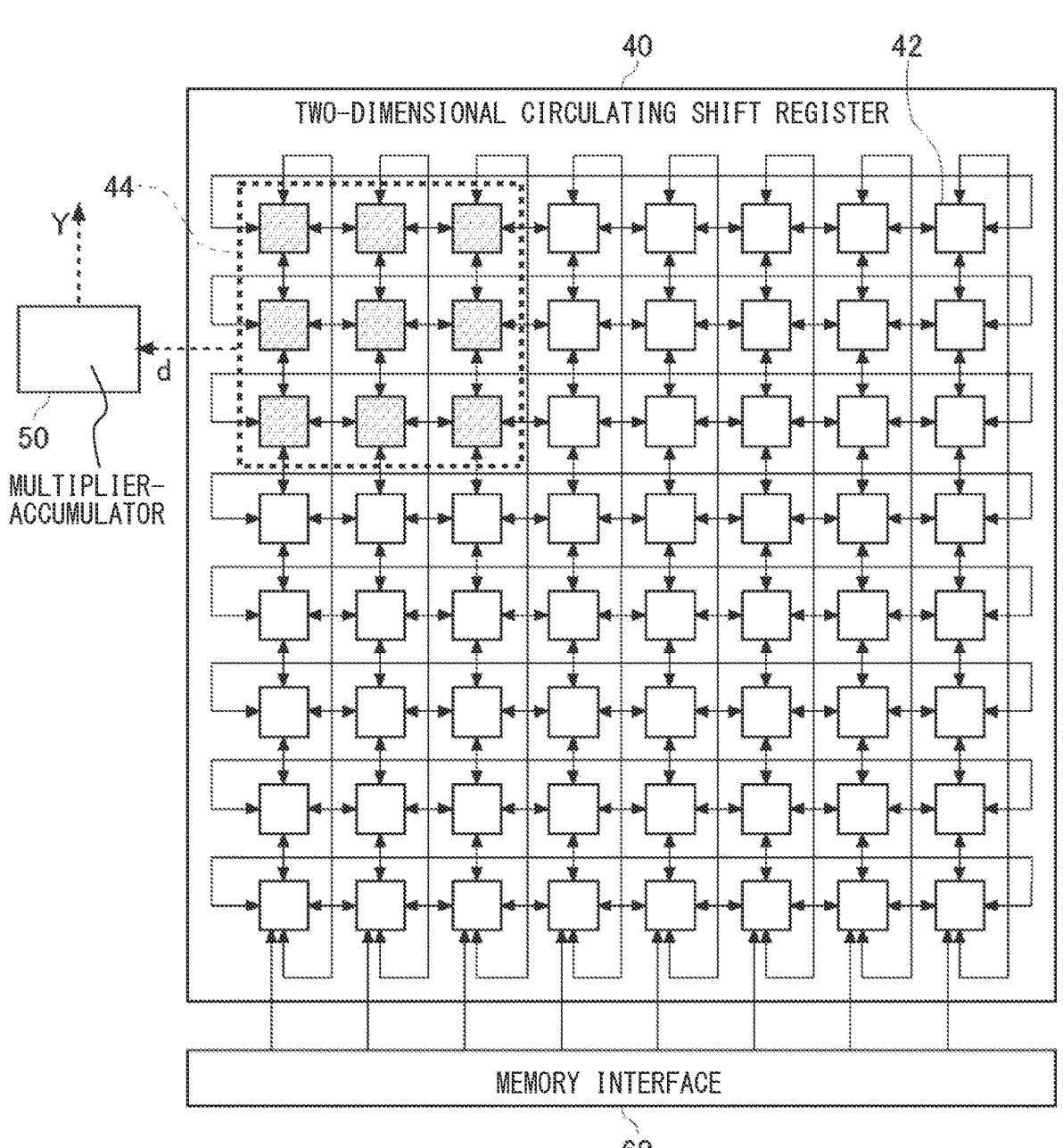
FIG. 3 is a block diagram showing a convolutional computation circuit according to the first embodiment of the present disclosure.

The convolutional computation circuit will be described with reference to FIG. 3.

The convolutional computation circuit is formed by a two-dimensional circulation shift register 40 and a multiplier-accumulator 50.

In the shift register 40, a large number of storage elements 42 are arranged two-dimensionally. In this embodiment, 64 storage elements 42 arranged in 8 by 8 having the zero-th row to the seventh row and the zero-th column to the seventh column.

Data elements are stored in each storage element 42. Each storage element 42 is connected to four storage elements 42 arranged vertically and horizontally of the storage element 42, and the data element of each storage element 42 can be shifted to the storage elements 42 arranged vertically and horizontally. The shift register 40 is a two-dimensional circulation type, and the storage elements 42 disposed on the bottom column, the top column, the right end row and the left end row is arranged on an up side, a down side, a left side and a right side of the storage elements 42 disposed on the top column, the bottom column, the left end row, and the right end row, respectively. Here, when each storage element 42 is connected to n adjacent storage elements 42 and, when the data element is shifted between the storage element 42 and n adjacent storage elements 42, the shift amount is defined as n. In the present embodiment, each storage element 42 is connected only to the storage elements 42 adjacent to each other vertically and horizontally, and the data element of each storage element 42 can be shifted only to the storage elements 42 adjacent to each other vertically and horizontally, so that the shift amount is defined as 1.

A memory interface 60 is connected to the shift register 40. Data elements are sequentially input from the memory interface 60 to each storage element 42 in the bottom row of the shift register 40. By sequentially shifting the data elements, input to each storage element 42 in the bottom row, upward, so that the data elements are stored in all the storage elements 42.

In the shift register 40, the input window 44 is set in a predetermined area. The data element stored in the storage element 42 in the input window 44 is selected as the input data d and outputs to the multiplier-accumulator 50. In the present embodiment, the input window 44 is set in the area including the storage elements 42 in the 3 by 3 matrix having the 0-th row to the second row and the 0-th column to the second column. Then, the input data d with of 3 rows and 3 columns is selected from the total data elements of 8 rows and 8 columns, and the input data d of 3 rows and 3 columns is output to the multiplier-accumulator 50.

Figure 4:
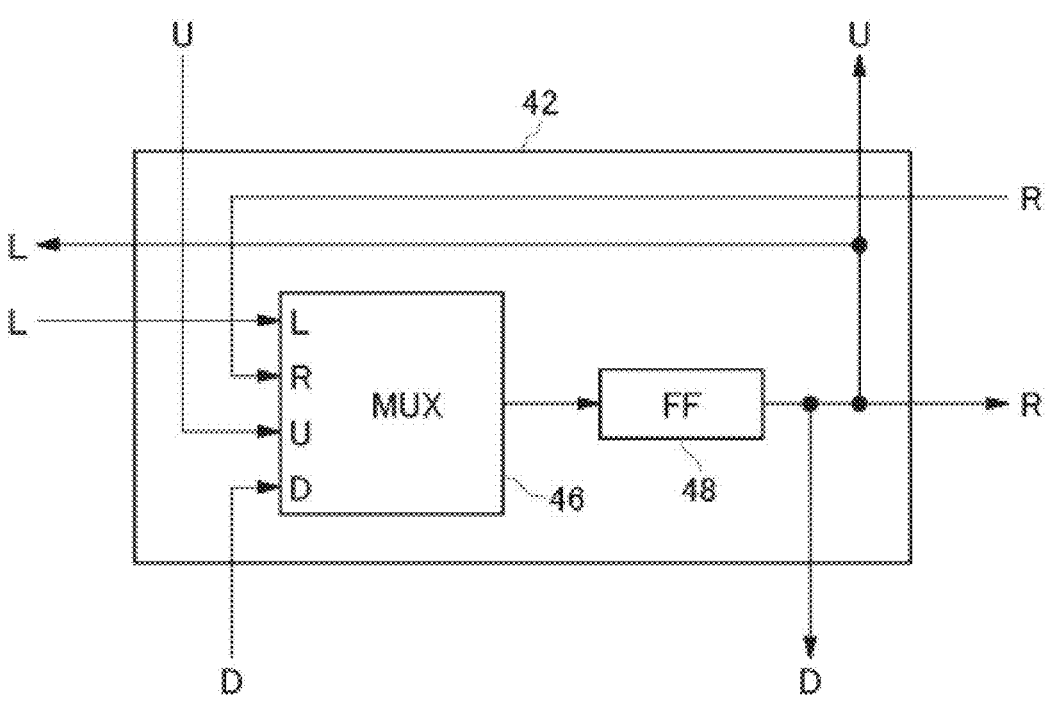
FIG. 4 is a block diagram showing a storage element according to the first embodiment of the present disclosure.

The storage element 42 of the shift register 40 will be described in detail with reference to FIG. 4.

The storage element 42 is formed of a multiplexer 46 (MUX) and a flip-flop 48 (FF). In the present embodiment, data elements are input to the multiplexer 46 from flip-flops 48 of storage elements 42 adjacent to each other in the vertical and horizontal directions. The multiplexer 46 selects one data element from the four input data elements and outputs it to the flip-flop 48 of the storage element 42. The flip-flop 48 holds the data element input from the multiplexer 46.

Figure 5:
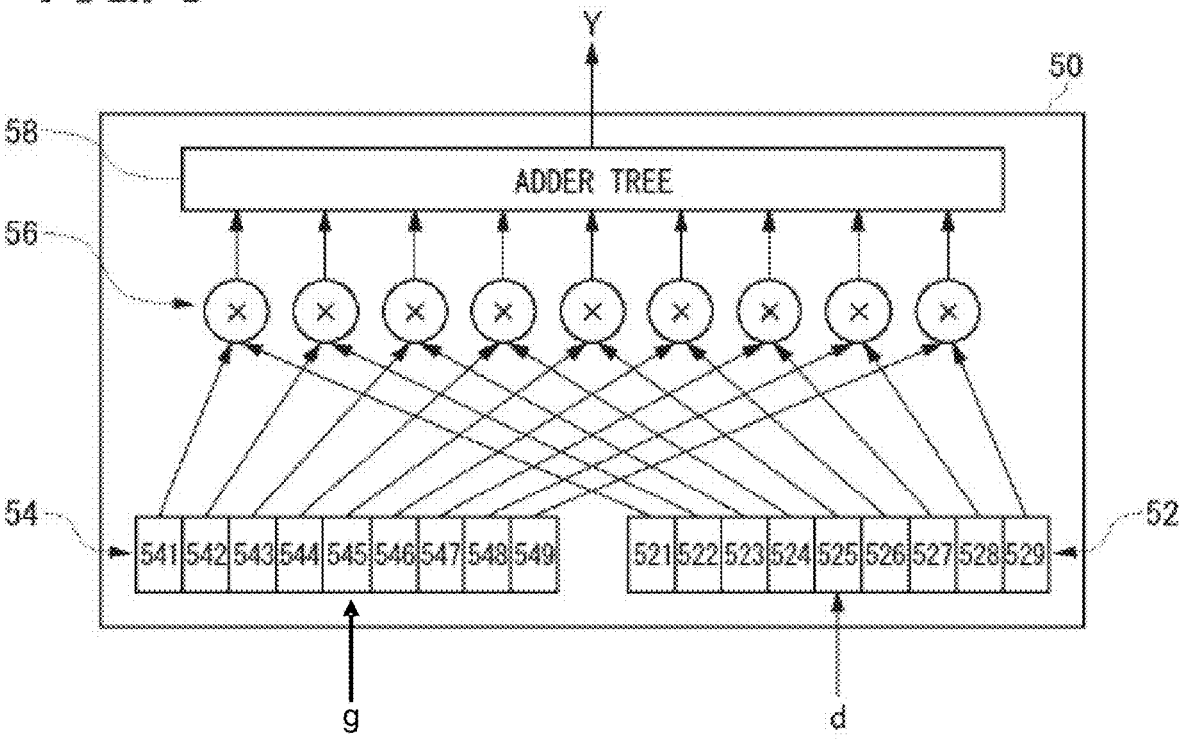
FIG. 5 is a block diagram showing a multiplier-accumulator according to the first embodiment of the present disclosure.

The multiplier-accumulator 50 will be described with reference to FIG. 5.

The multiplier-accumulator 50 performs a multiply-accumulate operation of the input data d and the weight data w forming a predetermined filter to generate the output data Y. That is, as shown by the following equation (1), the Frobenius product of the input data d and the weight data g is defined as the output data Y. Here, $d_{qr}$ is an input data element forming the input data d, and $g_{qr}$ is a weight data element forming the weight data g.

Equation 1

$$Y = g{:}d = \sum_{q,r} g_{qr} d_{qr} \qquad (1)$$

In the present embodiment, according to the input data d ($d_{qr}$: q=0 to 2; r=0 to 2) in 3 rows by 3 columns and the weight data g ($g_{qr}$: q=0 to 2; r=0 to 3) in 3 rows by 3 columns, the output data Y of 1 row by 1 column is generated. Therefore, the number of multiplications in the multiply-accumulate operation is nine.

The multiplier-accumulator 50 includes an input register 52, a weight register 54, a multiplier 56, and an adder tree 58. The input register 52 holds an input data element $d_{qr}$ that forms the input data d input from the shift register 40. The weight register 54 holds a weight data element $g_{qr}$ that forms the weight data g input from an interface (not shown). In this embodiment, the input register 52 and the weight register 54 each include nine storage areas, respectively 52*n* (521 to 529) and 54*n* (541 to 549). Each multiplier 56 multiplies each input data element $d_{qr}$ of the input register 52 with each weight data element $g_{qr}$ of the weight register 54, and the adder tree 58 calculates the total multiplication result calculated by each multiplier 56. In this embodiment, nine multipliers 56 are used, and nine multiplier results are added by the adder tree 58.

The convolutional computation process of the present embodiment will be described with reference to FIGS. 6 to 8.

Figure 6:
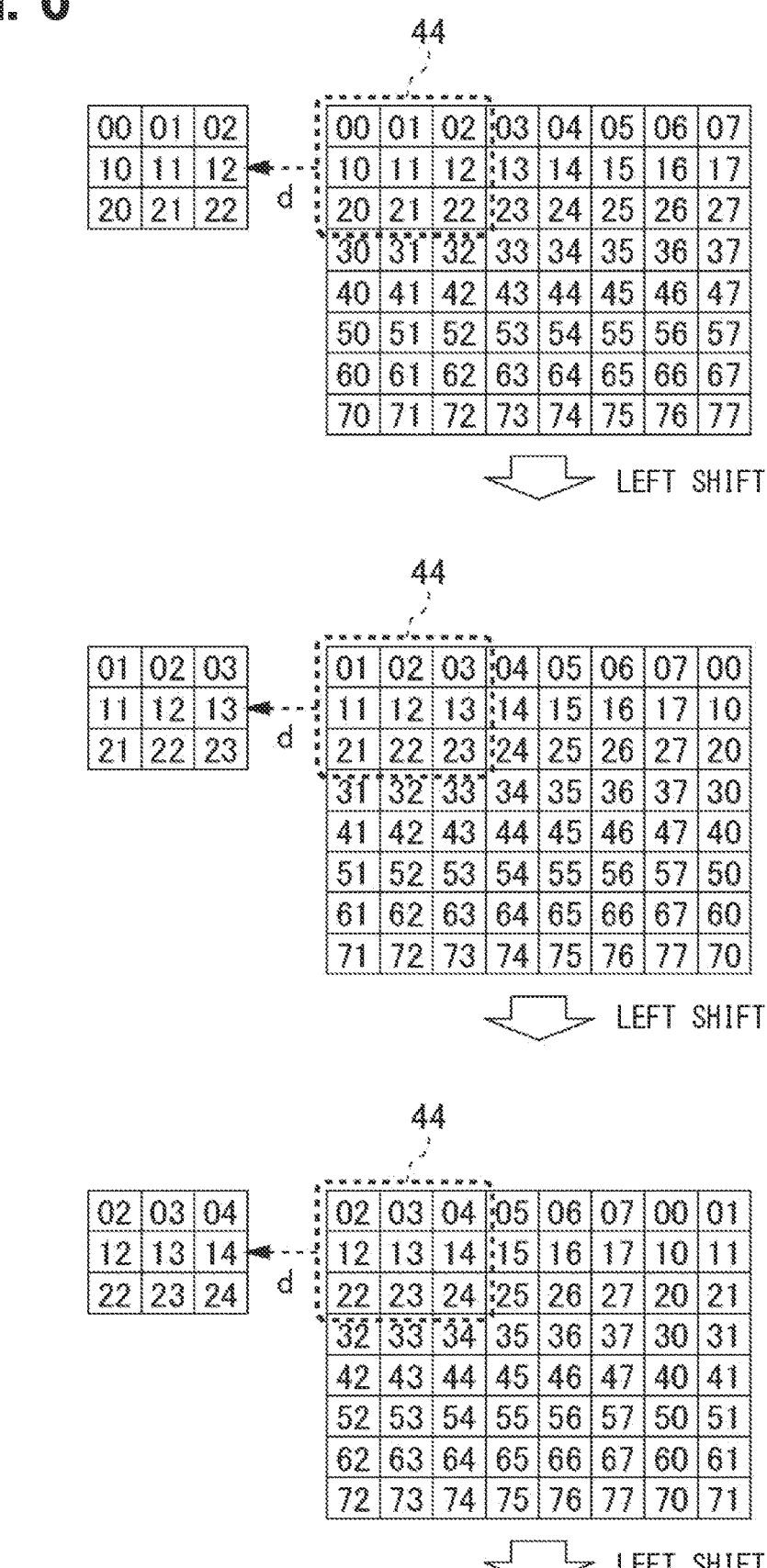
FIG. 6 is a schematic diagram showing selection of input data by shift operation according to the first embodiment of the present disclosure.

As shown in FIG. 6, in the shift register 40, the total data elements are sequentially shifted, and the data elements in the input window 44 are sequentially selected as the input data d. In the present embodiment, the total data elements ij (i=0 to 7; j=0 to 7) of 8 rows by 8 columns are sequentially shifted, and the data elements in the input window 44 having 3 by 3 matrix with the 0th row to the 2nd row and the 0th column to the 2nd column are sequentially selected as the input data d.

Figure 7:
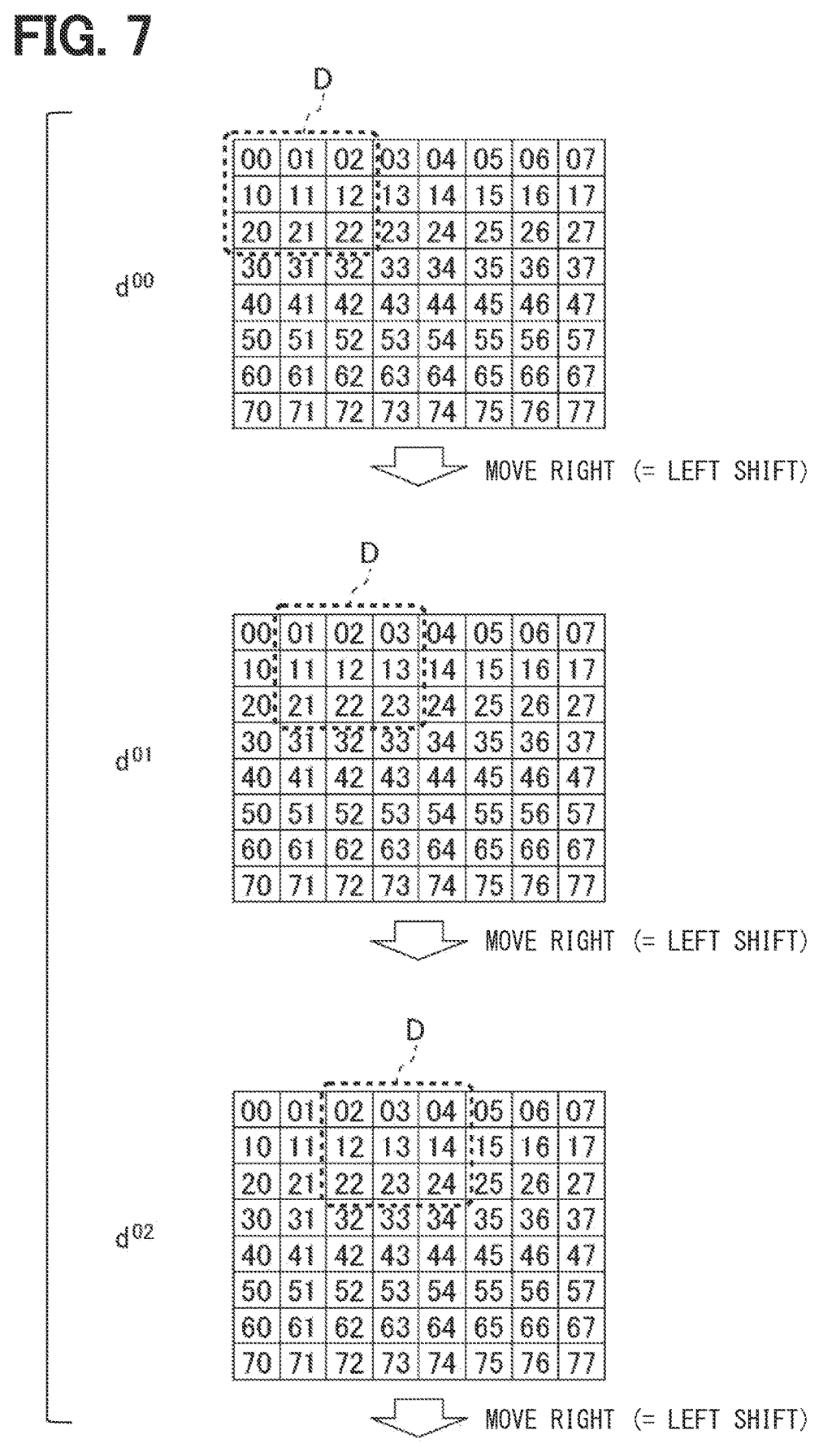

As shown in FIG. 7, the selection of the input data d by the shift operation in the shift register 40 corresponds to the movement of the total data elements in the input data range D. Here, the shift operation in the up/down/left/right directions in the shift register 40 corresponds to the movement of the total data elements in the input data range D in the opposite direction. In the following, the input data of the input data range D displaced downward and to the right by k and l with respect to the upper left as a reference is defined as $d^{kl}$, and the output data generated from the input data $d^{kl}$ is defined as $Y^{kl}$. In the present embodiment, in the total data element ij (i=0 to 7; j=0 to 7) in the 8 rows and 8 columns matrix, the input data range D in the 3 rows and 3 columns matrix is displaced by k and l in the downward direction and the right direction, respectively (k=0 to 5; l=0 to 5).

As shown in FIG. 8, in a series of shift operations, a shift operation with a shift amount of 1 and the numerical number of shift times of 1 is performed in one cycle from input data selection to the next input data selection, and 35 shift operations are performed in 35 cycles. By repeating the 35 cycles including before the start of the cycle, 36 input data $d^{kl}$ in the 3 rows and 3 columns matrix are selected, and 36 output data $Y^{kl}$ in the 1 row and 1 column matrix are generated based on 36 input data $d^{kl}$ in the 3 rows and 3 columns matrix. Then, the total output data Z in the 6 rows and 6 columns matrix having 36 output data $Y^{kl}$ as the element $z_{kl}$ is generated.

In the present embodiment, the number of shifts in the convolution operation is 35 times. Further, the total number of multiplications is 324 times by multiplying 9 times, which is the number of multiplications in the product-sum operation, and 36 times, which is the number of times of input data selection.

The convolutional computation circuit of the present embodiment has the following effects.

In the convolutional operation circuit of the present embodiment, since the convolutional operation is not converted into the matrix operation, it is not necessary to convert the input data so that the matrix operation can be performed, and it is not necessary to handle the converted data which is prepared by duplicating the original input data. Therefore, the increase in hardware and data processing is avoided, and the power consumption in the convolutional computation device is reduced.

First Modification of First Embodiment

Hereinafter, a first modification of the first embodiment of the present disclosure will be described.

In the convolutional computation circuit of this modification, a plurality of input window areas can be switched with each other in the shift register 40. That is, all the storage elements 42 included in the plurality of input window areas are connected to the multiplexer, and by selecting the input data elements input from the storage elements 42 in the multiplexer, the plurality of input window areas can be switched to each other.

For example, when a filter of the 3 rows 3 columns matrix, a filter of the 4 rows 4 columns matrix, or a filter of the 5 rows 5 columns matrix is used in the convolutional operation, the 0th to 2nd input window areas including the storage elements 42 in the 3 rows 3 columns matrix, the 4 rows 4 columns matrix, or the 5 rows 5 columns matrix corresponding to filters can be switched therebetween. As such 0th to 2nd input window areas, for example, (0) the zero-th input window area including the storage elements 42 in the 3 by 3 matrix from the 0th row to 2nd row and the 0th column to the 2nd column, (1) the 1st input window area including the storage elements 42 in the 4 by 4 matrix from the 0th row to 3rd row and the 0th column to the 3rd column, and (3) the 2nd input window area including the storage elements 42 in the 5 by 5 matrix from the 0th row to 4th row and the 0th column to the 4th column are available.

Regarding the convolutional computation circuit of this modification, since a plurality of input window areas can be switched with each other in the shift register 40, it is possible to handle various types of convolutional operations, and a highly versatile convolutional computation circuit is provided.

Second Modification of First Embodiment

Hereinafter, a second modification of the first embodiment of the present disclosure will be described.

In the convolutional computation circuit of this modification, the shift amount can be switched in the shift register 40. That is, the flip-flops 48 of the storage elements 42 disposed s1 storage elements away, s2 storage elements away, . . . , and sn storage elements away therefrom are connected to the multiplexer 46 of each storage element 42 in 42 in each of the up, down, left, and right directions. Here, n is equal to or larger than two. Then, in the multiplexer 46 of each storage element 42, the shift amount can be switched by changing the selection of the data element input from the flip-flop 48 in the storage element 42 disposed s1 storage elements away, s2 storage elements away, . . . , and sn storage elements away therefrom. Here, n is equal to or larger than two.

For example, in the shift register 40, in addition to the flip-flops 48 of the adjacent storage elements 42, the flip-flop 48 of the storage element 42 disposed two storage elements away from the storage element is connected to the multiplexer 46 of the storage element 42 in each of the up, down, left, and right directions. In the multiplexer 46 of each storage element 42, the shift amount is changed between one and two by switching which data element is selected to be input from the adjacent storage element or the storage element disposed two storage elements away from the storage element.

In the convolutional computation circuit of this modification, since the shift amount can be switched in the shift register 40, it is possible to handle various types of convolution calculations, and a highly versatile convolutional computation circuit is realized.

Further, by combining the first modification and the second modification of the first embodiment to switch the input data area and the shift amount in the shift register 40, a more versatile convolutional computation circuit can be obtained.

Second Embodiment

A second embodiment of the present disclosure will be described below with reference to the drawings of FIGS. 9 to 10.

In the convolutional computation circuit of the present embodiment, a plurality of input windows 44a-44d are set in the shift register 40.

Figure 9:
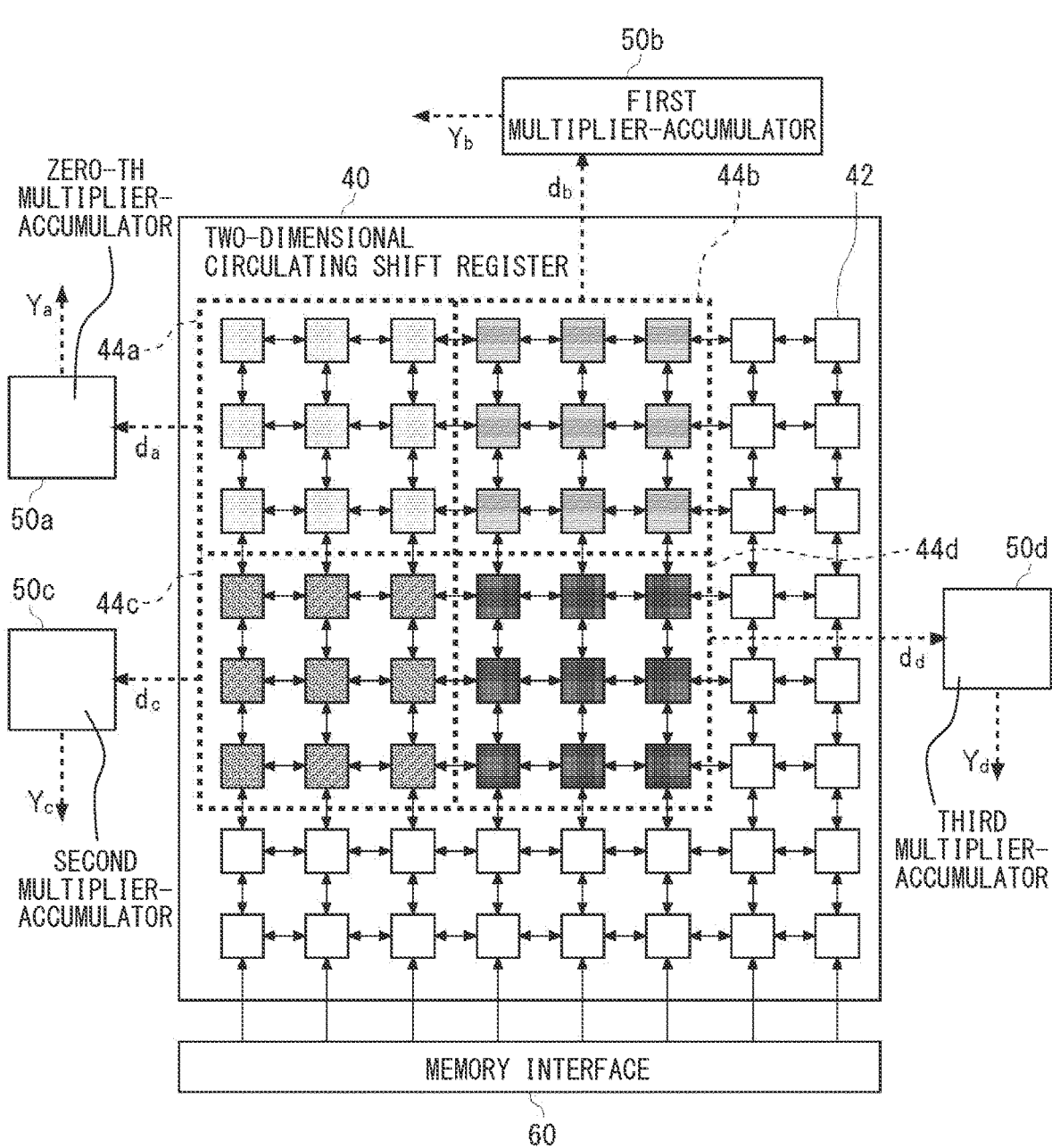
FIG. 9 is a block diagram showing a convolutional computation circuit according to the second embodiment of the present disclosure.

In FIG. 9, for the sake of simplification of the drawings, the signal lines are not shown between the storage elements 42 between the top row and the bottom row, and between the storage elements 42 between the leftmost column and the rightmost column.

As shown in FIG. 9, in the shift register 40 of the present embodiment, the 0th to 3rd input windows 44a-44d are set. As the 0th to 3rd input windows 44a-44d, (0) the 0th input window 44a including the storage elements 42 in the 3 rows and 3 columns matrix with the 0th row to the 2nd row and the 0th column to the 2nd column, (1) the first input window 44b including the storage elements 42 in the 3 rows and 3 columns matrix with the 0th row to the 2nd row and the third column to the 5th column, and (2) the second input window 44c including the storage elements 42 in the 3 rows and 3 columns matrix with the third row to the 5th row and the 0th column to the 2nd column, and (3) the third input window 44d including the storage elements 42 in the 3 rows and 3 columns matrix with the third row to the 5th row and the third column to the 5th column are available. The input data da to dd from the storage elements 42 in the 0th to 3rd input windows 44 are input to the 0th to 3rd multiplier-accumulator 50a to 50d, respectively, and output data $Y_a$ to $Y_d$ are generated in the 0th to 3rd multiplier-accumulator 50a to 50d.

In the convolutional computation process, a series of shift operations are executed in the shift register 40. As shown in FIG. 10, in a series of shift operations, a shift operation with a shift amount of 1 and the numerical number of shift times of 1 is performed in one cycle from input data selection to the next input data selection, and 8 shift operations are performed in 8 cycles. By executing the eight cycles, the input data $d^{mn}$, $d^{m3+n}$, $d^{3+mn}$, $d^{3+m3+n}$, each of which has nine 3 rows and 3 columns matrixes, are selected by the 0th to 3rd input windows 44a to 44d, in addition to before the start of the cycle (m=0 to 2; n=0 to 2), and nine output data $Y^{mn}$, $Y^{m3+n}$, $Y^{3+mn}$, $Y^{3+m3+n}$, each of which has 1 row and 1 column matrix, are generated from the input data $d^{mn}$, $d^{m3+n}$, $d^{3+mn}$, $d^{3+m3+n}$, each of which has nine 3 rows and 3 columns matrixes. Then, as in the first embodiment, the total output data Z of 6 rows and 6 columns matrix having 36 output data $Y^{kl}$ as the element $z^{kl}$ is generated.

In the present embodiment, the number of shifts in convolution operation is 8 times. Further, the total number of multiplications is 324 times by multiplying 9 times, which is the number of multiplications in the multiply-accumulate operation, 4 times, which is the number of input windows 44a to 44d, and 9 times, which is the number of selection times of input data.

The convolutional computation circuit of the present embodiment has the following effects.

In the convolutional computation circuit of the present embodiment, since a plurality of input windows 44a to 44d are set in the shift register 40, the same output is acquired with a smaller number of shift operations as compared with the case where a single input window 44 is set. Thus, the convolutional operation can be executed at high speed.

Third Embodiment

A third embodiment of the present disclosure will be described below with reference to the drawings of FIGS. 11 to 13.

The convolutional computation circuit of the present embodiment performs a multiply-accumulate calculation based on the Winograd algorithm, selects input data of 5 rows and 5 columns matrix for a filter of 3 rows and 3 columns matrix, and generates the output data of 3 rows and 3 columns matrix.

Figure 11:
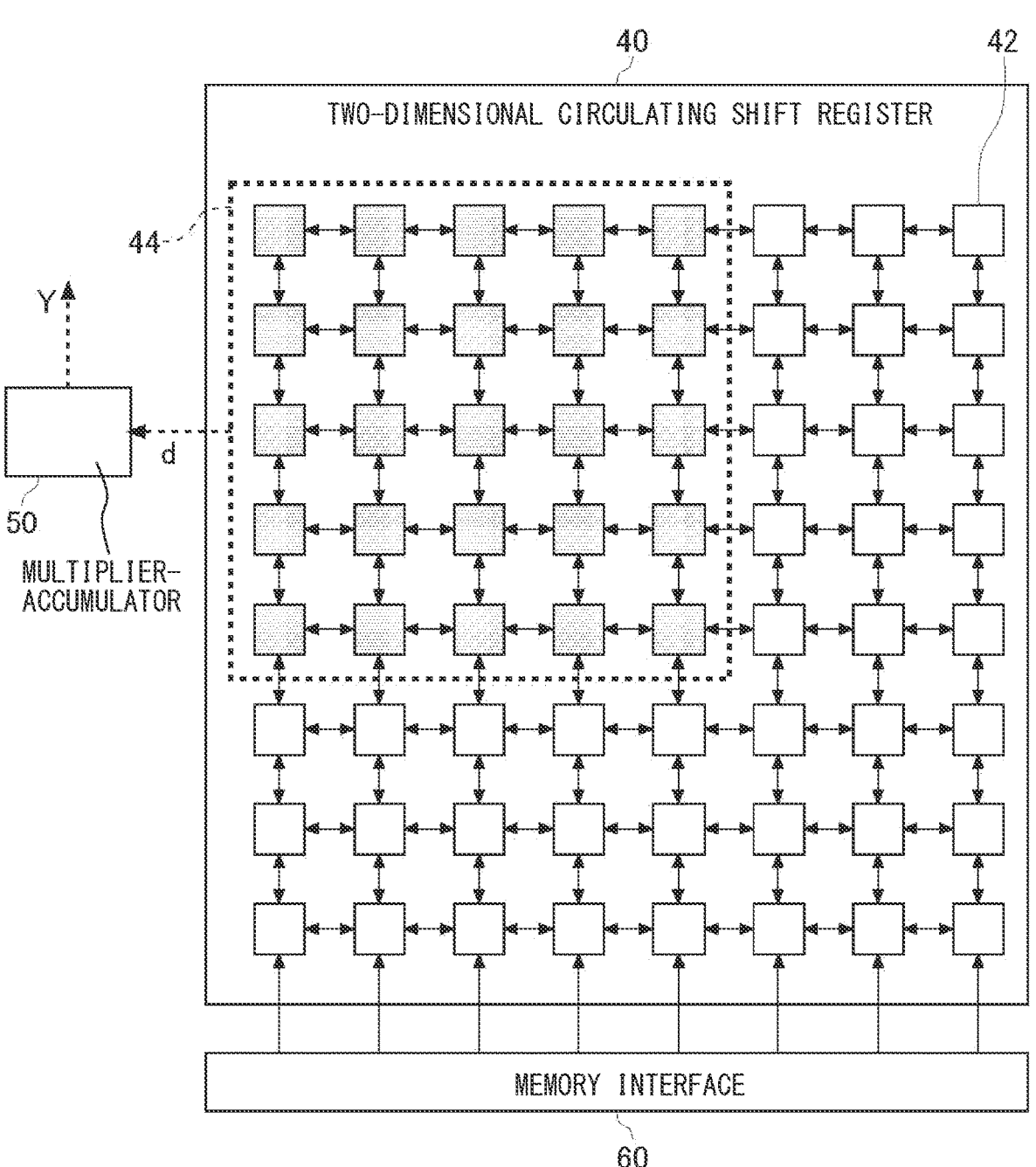
FIG. 11 is a block diagram showing a convolutional computation circuit according to the third embodiment of the present disclosure.

In FIG. 11, similar to FIG. 9, for the sake of simplification of the drawings, the signal lines are not shown between the storage elements 42 between the top row and the bottom row, and between the storage elements 42 between the leftmost column and the rightmost column.

As shown in FIG. 11, in the shift register 40, an input window 44 including the storage elements 42 of the 0th row to the 4th row and the 0th column 0 to the 4th column in the 5 rows and 5 columns matrix is set.

The multiplier-accumulator 50 performs a multiply-accumulate calculation of the input data d and the weight data g based on the Winograd algorithm, as shown in the following equation (2). Here, G, B, and A are constant matrixes.

Equation (2)

$$Y=A^T[[GgG^T]\odot[B^T \, dB]]A \qquad (2)$$

In the present embodiment, the output data Y of 3 rows and 3 columns matrix is generated by the multiply-accumulate calculation of the input data d of 5 rows and 5 columns matrix and the weight data g of 3 rows and 3 columns matrix. The constant matrixes G, B, and A are as shown in FIG. 12. The weight term $GgG^T$ is calculated in advance. Therefore, in the present embodiment, the number of multiplications in the multiply-accumulate operation is 25 times. Further, as shown in FIG. 12, the constant matrixes B and A have one of the elements 1, 2, 3, and 4, and the multiplication operation can be executed only by the bit shift operation and the addition operation.

The convolutional computation process of the present embodiment will be described with reference to FIG. 13.

Figure 13:
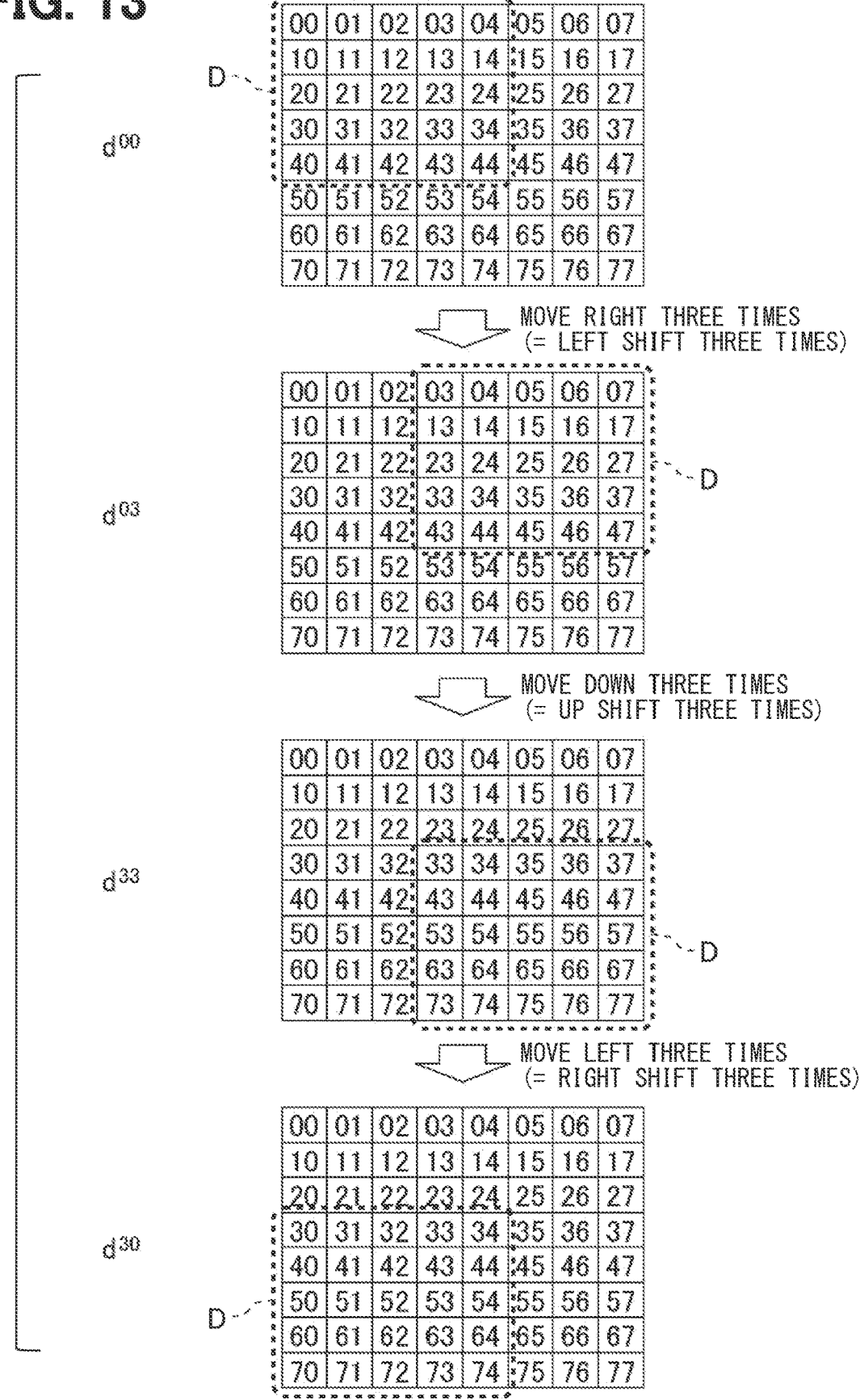
FIG. 13 is a conceptual diagram showing the movement of the input data range according to the third embodiment of the present disclosure.

In the present embodiment, as shown in FIG. 13, in the total data element ij (i=0 to 7; j=0 to 7) of 8 rows and 8 columns matrix, the input data range D of 5 rows and 5 columns matrix is displaced by k and l (k=0,3; l=0,3) in the right direction and the down direction, respectively.

As shown in FIG. 13, in a series of shift operations, a shift operation with a shift amount of 1 and the numerical number of shift times of 3 is performed in one cycle from input data selection to the next input data selection, and 9 shift operations are performed in 3 cycles. By repeating the 3 cycles in addition to before the start of the cycle, 4 input data $d^{kl}$ in the 5 rows and 5 columns matrix are selected, and 4 output data $Y^{kl}$ in the 3 row and 3 column matrix are generated based on 4 input data $d^{kl}$ in the 5 rows and 5 columns matrix. Then, a total output data Z of 6 rows and 6 columns matrix is generated in which the output data element $y^{kl}_{op}$ (o=0 to 2; p=0 to 2) in the output data $Y^{kl}$, each of which has 3 rows and 3 columns matrix, is the element $z_{k+ol+p}$.

In the present embodiment, the number of shifts in the convolution operation is 9 times. Further, the total number of multiplications is 100 times by multiplying 25 times, which is the number of multiplications in the product-sum operation, and 4 times, which is the number of times of input data selection.

The convolutional computation circuit of the present embodiment has the following effects.

In the convolutional computation circuit of the present embodiment, the number of multiplications and the number of shifts can be significantly reduced by performing the multiply-accumulate calculation based on the Winograd algorithm. In addition, by selecting the input data of 5 rows and 5 columns matrix for the filter of 3 rows and 3 columns matrix and generating the output data of 3 rows and 3 columns matrix, the multiplication operation can be performed only by the bit shift operation and the addition operation. Therefore, it is possible to execute the convolutional operation at sufficiently high speed and with low power consumption.

First Modification of Third Embodiment

Hereinafter, a first modification of the third embodiment will be described.

Regarding the convolutional computation circuit of this modification, the shift amount is set to 3 in the shift register 40 of the third embodiment. As described in the first embodiment, each storage element 42 is connected to three adjacent storage elements 42, and the data element is shifted between each storage element 42 and the three adjacent storage elements 42. Thus, it is possible to realize a shift with a shift amount of 3. In the shift register 40, a shift operation with a shift amount of 3 and a number of shift times of 1 is performed in one cycle from input data selection to the next input data selection, and three shifts are executed in three cycles. Therefore, the number of shifts in this modified example is three.

As described above, in this modification, the number of shifts in the convolutional operation is further reduced, and the convolutional operation can be executed at higher speed and lower power consumption.

Second Modification of Third Embodiment

Hereinafter, a second modification of the third embodiment will be described.

Regarding the convolutional computation circuit of this modification, the shift register 40 of the third embodiment is capable of switching between the 0th to 3rd input window areas instead of the shift operation. As the 0th to 3rd input window areas, (0) the 0th input window area including the storage elements 42 in the 5 rows and 5 columns matrix with the 0th row to the 4th row and the 0th column to the 4th column, (1) the first input window area including the storage elements 42 in the 5 rows and 5 columns matrix with the 0th row to the 4th row and the third column to the 7th column, and (2) the second input window area including the storage elements 42 in the 5 rows and 5 columns matrix with the third row to the 7th row and the 0th column to the 4th column, and (3) the third input window area including the storage elements 42 in the 5 rows and 5 columns matrix with the third row to the 7th row and the third column to the 7th column are available. Then, the 0th to 3rd input window areas are sequentially switched to select input data, sequentially output data is generated from the input data, and total output data is generated from the output data.

As described above, in this modification, by switching the input window area in the convolutional operation, the shift operation is unnecessary, and the convolutional operation can be executed at higher speed and lower power consumption.

While the present disclosure has been described in accordance with the embodiment, it is understood that the present disclosure is not limited to such embodiments or structures. The present disclosure incorporates various modifications and variations within a scope of equivalents. In addition, various combinations and configurations, as well as other combinations and configurations that include only one element, more, or less, are within the scope and spirit of the present disclosure.

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

What is claimed is:

1. A convolutional computation device comprising:
   a two-dimensional circulation shift register unit that has a plurality of storage elements arranged two-dimensionally and respectively storing data, cyclically shifts the data among the plurality of storage elements, provides at least one input window in a predetermined area, and selects the data stored in one of the plurality of storage elements disposed in the at least one input window as input data; and
   at least one multiplier-accumulator that generates output data by performing a multiply-accumulate operation on the input data input from the two-dimensional circulation shift register unit and weight data from a predetermined filter,
   wherein:
   each storage element of the plurality of storage elements includes a multiplexer and a flip-flop, the flip-flop in each storage element is configured to store data output by the multiplexer in each storage element, the multiplexer in each storage element is directly connected by signal lines to the flip-flops of directly adjacent storage elements of the plurality of storage elements, the directly adjacent storage elements being directly adjacent via signal lines in each of an up direction and a down direction from each storage element and directly adjacent via signal lines in each of a left direction and a right direction from each storage element, and the multiplexer in each storage element is configured to select one data element of the directly adjacent storage elements and output data from the selected one data element.

2. The convolutional computation device according to claim 1, wherein:
   the at least one multiplier-accumulator performs the multiply-accumulate operation based on a Winograd algorithm;
   the predetermined filter is a 3 rows and 3 columns matrix filter;
   the input data is a 5 rows and 5 columns matrix input data; and the output data is a 3 rows and 3 columns matrix output data.

3. The convolutional computation device according to claim 2, wherein the Winograd algorithm is defined by an equation:

$$Y = A^T[[GgG^T] \odot [B^T dB]]A \qquad (2)$$

where

Y is an output data;

A, B and G are constant matrixes;

g is a weight data;

d is an input data;

a weight term of $GgG^T$ is calculated in advance; and the constant matrixes B and A have one of the elements 0, ±1, ±2, ±3, and ±4.

4. The convolutional computation device according to claim 1, wherein:

the two-dimensional circulation shift register unit has a plurality of input windows including the at least one input window to select a plurality of the input data, the at least one multiplier-accumulator further comprises a plurality of multiplier-accumulators into which the plurality of the input data are input from the two-dimensional circulation shift register unit, respectively.

5. The convolutional computation device according to claim 1, wherein:

the two-dimensional circulation shift register unit changes an input window area of the at least one input window or a shift amount of the shift that cyclically shifts the data.

6. The convolutional computation device according to claim 1, wherein:

each storage element is connected to only four storage elements arranged vertically and horizontally of the each storage element.

7. The convolutional computation device according to claim 1, further comprising a memory interface connected to the two-dimensional circulation shift register unit, wherein data elements are sequentially input from the memory interface to each storage element in a bottom row of the two-dimensional circulation shift register unit.

8. The convolutional computation device according to claim 1, wherein the at least one multiplier-accumulator includes an input register, a weight register, at least one multiplier, and an adder tree, the input register is configured to hold the input data in a plurality of input data element storage areas, the weight register is configured to hold the weight data in a plurality of weight data element storage areas, the at least one multiplier is configured to multiply each input data element of the plurality of input data element storage areas with respectively each weight data element of the plurality of weight data element storage areas to generate multiplier results, and the adder tree is configured to calculate a total multiplication result from the multiplier results generated by the at least one multiplier.

9. The convolutional computation device according to claim 1, wherein the at least one input window comprises a plurality of input window areas which are configured to be switched with each other in the two-dimensional circulation shift register unit.

10. The convolutional computation device according to claim 1, wherein the at least one input window comprises a plurality of input window areas which are configured to be sequentially switched to select the input data, and the output data is sequentially generated from the input data.

11. The convolutional computation device according to claim 1, wherein the multiply-accumulate operation is performed only by a bit shift operation and an addition operation.

12. The convolutional computation device according to claim 1, wherein the plurality of storage elements which are arranged two-dimensionally are arranged in rows and columns.

* * * * *